US009147680B2

(12) United States Patent
Trevino et al.

(10) Patent No.: US 9,147,680 B2
(45) Date of Patent: Sep. 29, 2015

(54) INTEGRATED CIRCUITS HAVING REPLACEMENT METAL GATES WITH IMPROVED THRESHOLD VOLTAGE PERFORMANCE AND METHODS FOR FABRICATING THE SAME

(71) Applicant: GLOBALFOUNDRIES, Inc., Grand Cayman (KY)

(72) Inventors: Kristina Trevino, Austerlitz, NY (US); Yuan-Hung Lin, Cahoes, NY (US); Gabriel Padron Wells, Saratoga Springs, NY (US); Chang Ho Maeng, Clifton Park, NY (US); Taejoon Han, Clifton Park, NY (US); Hoong Shing Wong, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 128 days.

(21) Appl. No.: 13/943,944

(22) Filed: Jul. 17, 2013

(65) Prior Publication Data

US 2015/0021694 A1 Jan. 22, 2015

(51) Int. Cl.
*H01L 27/088* (2006.01)
*H01L 21/28* (2006.01)

(52) U.S. Cl.
CPC ........ *H01L 27/088* (2013.01); *H01L 21/28008* (2013.01)

(58) Field of Classification Search
CPC ............ H01L 29/785; H01L 29/66795; H01L 29/66545; H01L 21/32137; H01L 21/28097; H01L 21/823835; H01L 21/823842; H01L 29/66439; H01L 29/0673; H01L 29/0665
USPC ........... 257/24, 308, 204, 355; 438/164, 270, 438/299, 289, 591, 585, 510
See application file for complete search history.

(56) References Cited

U.S. PATENT DOCUMENTS

| 7,029,959 B1* | 4/2006 | Yang et al. ............... 438/164 |
|---|---|---|
| 2006/0006446 A1* | 1/2006 | Schwerin ................. 257/308 |
| 2006/0084247 A1* | 4/2006 | Liu .......................... 438/510 |
| 2010/0240204 A1* | 9/2010 | Yeh et al. ................ 438/585 |
| 2012/0135575 A1* | 5/2012 | Wong et al. ............. 438/289 |

OTHER PUBLICATIONS

Intellectual Property Office, Examination Report for Taiwanese Patent Application No. 103104527 mailed May 26, 2015.

* cited by examiner

*Primary Examiner* — Kenneth Parker
*Assistant Examiner* — Bo Fan
(74) *Attorney, Agent, or Firm* — Ingrassia Fisher & Lorenz, P.C.

(57) ABSTRACT

Integrated circuits having replacement metal gates with improved threshold voltage performance and methods for fabricating such integrated circuits are provided. A method includes providing a dielectric layer overlying a semiconductor substrate. The dielectric layer has a first and a second trench. A gate dielectric layer is formed in the first and second trench. A first barrier layer is formed overlying the gate dielectric layer. A work function material layer is formed within the trenches. The work function material layer and the first barrier layer are recessed in the first and second trench. The work function material layer and the first barrier layer form a beveled surface. The gate dielectric layer is recessed in the first and second trench. A conductive gate electrode material is deposited such that it fills the first and second trench. The conductive gate electrode material is recessed in the first and second trench.

19 Claims, 6 Drawing Sheets

INTEGRATED CIRCUITS HAVING REPLACEMENT METAL GATES WITH IMPROVED THRESHOLD VOLTAGE PERFORMANCE AND METHODS FOR FABRICATING THE SAME

TECHNICAL FIELD

The technical field generally relates to integrated circuits and methods for fabricating integrated circuits, and more particularly relates to integrated circuits having replacement metal gates with improved threshold voltage performance and methods for fabricating the same.

BACKGROUND

Transistors such as metal oxide semiconductor field effect transistors (MOSFETs) or simply field effect transistors (FETs) or MOS transistors are important building blocks of the vast majority of semiconductor integrated circuits (ICs). An FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A FINFET is a type of transistor that lends itself to the goals of reducing transistor size while maintaining transistor performance. As illustrated in FIG. 1, the FINFET 200 is a non-planar, three dimensional transistor formed in part in a thin fin 212 that extends upwardly from a semiconductor substrate 214. FIG. 1 shows only one gate 216 and two fins 212 for simplicity although typically an integrated circuit can have thousands of fins and gates. The semiconductor substrate may be a bulk silicon wafer from which the fin structures are formed or may be a silicon-on-insulator (SOI) wafer disposed on a support substrate. The SOI wafer includes a silicon oxide layer and a silicon-containing material layer overlying the silicon oxide layer. The fin structures are formed from the silicon-containing material layer. The fin structures are typically formed using conventional photolithographic and anisotropic etching processes (e.g., reactive ion etching (RIE) or the like). The vertical gate 216 is disposed over the fins such that the two vertical sidewalls 218 of the fin form the channel of the transistor.

Replacement metal gate (RMG) processing is often used during FinFET formation. FIGS. 2-5 illustrate a conventional method for forming a portion of an integrated circuit 10 with a p-channel FET (PFET) 12 and an n-channel FET (NFET) 14 using an RMG process. Referring to FIG. 2, a dielectric material layer 16 overlies a semiconductor material 18. The semiconductor material is a fin structure of a non-planar transistor, such as, for example, a FinFET. The dielectric material layer is, for example, a silicon oxide. A first trench 20 corresponding to the PFET 12 and a second trench 22 corresponding to the NFET 14 are formed in the dielectric material layer 16. A gate dielectric layer 24 is deposited within the trenches. A first barrier material layer or combination of layers 26 is deposited overlying the gate dielectric layer 24 and a second barrier material layer or combination of layers 28 is deposited overlying the first barrier material layer or combination of layers 28. The first barrier material layer or combination of layers 26, for example, may be tantalum nitride overlying titanium nitride and the second barrier material layer or combination of layers 28, for example, may be titanium nitride. A mask material 30 is deposited overlying second barrier material layer or combination of layers 28 and a photoresist 32 is formed overlying mask material 30.

Referring to FIG. 3, the photoresist is patterned and the mask material 30 is correspondingly etched to cover a portion of the second barrier material layer 28 in trench 20. The second barrier material layer 28 then is etched from trench 22 and a portion of trench 20. Referring to FIG. 4, the photoresist 32 and the mask material 30 are removed and a work function material 34 is then conformally deposited within the trenches 20 and 22. The work function material, for example, is titanium aluminum (TiAl). An additional TiN layer (not shown) is deposited overlying the work function material, followed by the deposition of a gate electrode material 36, such as tungsten. Next, as illustrated in FIG. 5, a recess etch is performed to recess the gate electrode material 36 within the trenches 20 and 22.

The convention process of RMG results in high aspect ratio trenches that are difficult to fill. As illustrated in FIG. 5, deposition of tungsten often results in voids within the tungsten gate electrodes. If a void is present in a gate electrode, etch back of the gate electrode to remove the void results in removal of more of the gate electrode than is desired. In turn, such etch back of the tungsten to remove the voids results in gate electrode height variability. In addition, the conventional process leaves gate dielectric "stringers" 40. The stringers cannot be removed at this stage because, if the gate dielectric is hafnium oxide or a similar high-k dielectric constant material as is often the case, wet etching is ineffective to remove the stringers and a dry plasma etch of the gate dielectric stringers will damage the titanium nitride and tantalum nitride layers of the NFET 14. These defects are considered detrimental to threshold voltage performance.

Accordingly, it is desirable to provide methods for fabricating integrated circuits having replacement metal gates with improved threshold voltage performance. In addition, it is desirable to provide integrated circuits having replacement metal gates with improved threshold voltage performance. Furthermore, other desirable features and characteristics will become apparent from the subsequent detailed description and the appended claims, taken in conjunction with the accompanying drawings and this background.

BRIEF SUMMARY

Integrated circuits having replacement metal gates with improved threshold voltage performance and methods for fabricating such integrated circuits are provided herein. In accordance with an exemplary embodiment, a method for fabricating an integrated circuit includes providing a bulk dielectric layer overlying a semiconductor substrate. The bulk dielectric layer has a first trench and a second trench. A gate dielectric layer is formed in the first trench and the second trench. A first barrier layer is formed overlying the gate dielectric layer. A work function material layer is formed within the first trench and the second trench. The work function material layer and the first barrier layer are recessed in the first trench and the second trench. The work function material layer and the first barrier layer form a chamfered surface relative to a planar surface of the bulk dielectric layer. The gate dielectric layer is recessed in the first trench and the second trench. A conductive gate electrode material is deposited such that it fills the first trench and the second trench. The conductive gate electrode material is recessed in the first trench and the second trench.

In accordance with another exemplary embodiment, a method for fabricating an integrated circuit includes providing a dielectric layer overlying a semiconductor substrate, the dielectric layer having a first trench and a second trench. A gate dielectric layer is formed in the first trench and the second trench and a first barrier metal layer is formed overlying the gate dielectric layer. A second barrier metal layer is deposited overlying the first barrier metal layer. A patterned mask is formed such that the patterned mask partially fills the first trench and overlies a first portion of the second barrier metal layer. A second portion of the second barrier metal layer is exposed. The second portion of the second barrier metal layer is removed and the patterned mask is removed. A work function material layer is formed within the first trench and the second trench. A mask material is formed within the first trench and the second trench and the mask material is etched such that the mask material fills a portion of the first trench and a portion of the second trench. A portion of the work function material layer and a portion of the first barrier metal layer are anisotropicallly etched. A portion of the gate dielectric layer is etched and the mask material is removed from the first trench and the second trench. A conductive gate material is deposited overlying the work function material layer in the first trench and the second trench. A portion of the conductive gate material is removed within the first trench and the second trench.

In accordance with an exemplary embodiment, an integrated circuit having a metal gate structure includes a gate dielectric layer having two opposing members and a joining member overlying a semiconductor substrate and joining the two opposing members. A first barrier metal layer overlies the gate dielectric layer and a work function material layer overlies the first barrier metal layer. A conductive gate electrode has a linear portion and a cross portion. The linear portion overlies the work function material layer. The cross portion is perpendicular to the linear portion and overlies the gate dielectric layer, the first barrier metal layer and the work function material layer. The first barrier metal layer and the work function material layer have a chamfered surface.

BRIEF DESCRIPTION OF THE DRAWINGS

The various embodiments will hereinafter be described in conjunction with the following drawing figures, wherein like numerals denote like elements, and wherein:

FIGS. 3-11 illustrate in cross-sectional view an integrated circuit having replacement metal gates with improved threshold voltage performance and a method for fabricating the integrated circuit in accordance with an exemplary embodiment.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Various embodiments of an integrated circuit having replacement metal gates with improved threshold voltage and methods for fabricating such an integrated circuit are provided herein. The embodiments for NFETs and PFETs employ novel work function layout designs of TiN/TaN/TiAl and TiN/TaN/TiN/TiAl, respectively. Conventional threshold voltage device readouts achieved with present work function configurations are deemed poor, with high threshold voltage measured values of up to 0.8 V for device turn on. The various embodiments contemplated herein increase RMG filling capacity, maintaining lower aspect ratio for subsequent metal filling steps and thus improving gate electrode metal recess process stability. In addition, NFET layout is optimized by introducing a chamfer angle that minimizes or eliminates the potential generation of voids in the gate electrode deposition. Overall, this novel layout comprises improvements to drive threshold voltage performance with the acceptable margin (i.e., 0.3V) typically required by device design specifications.

Figure 1:
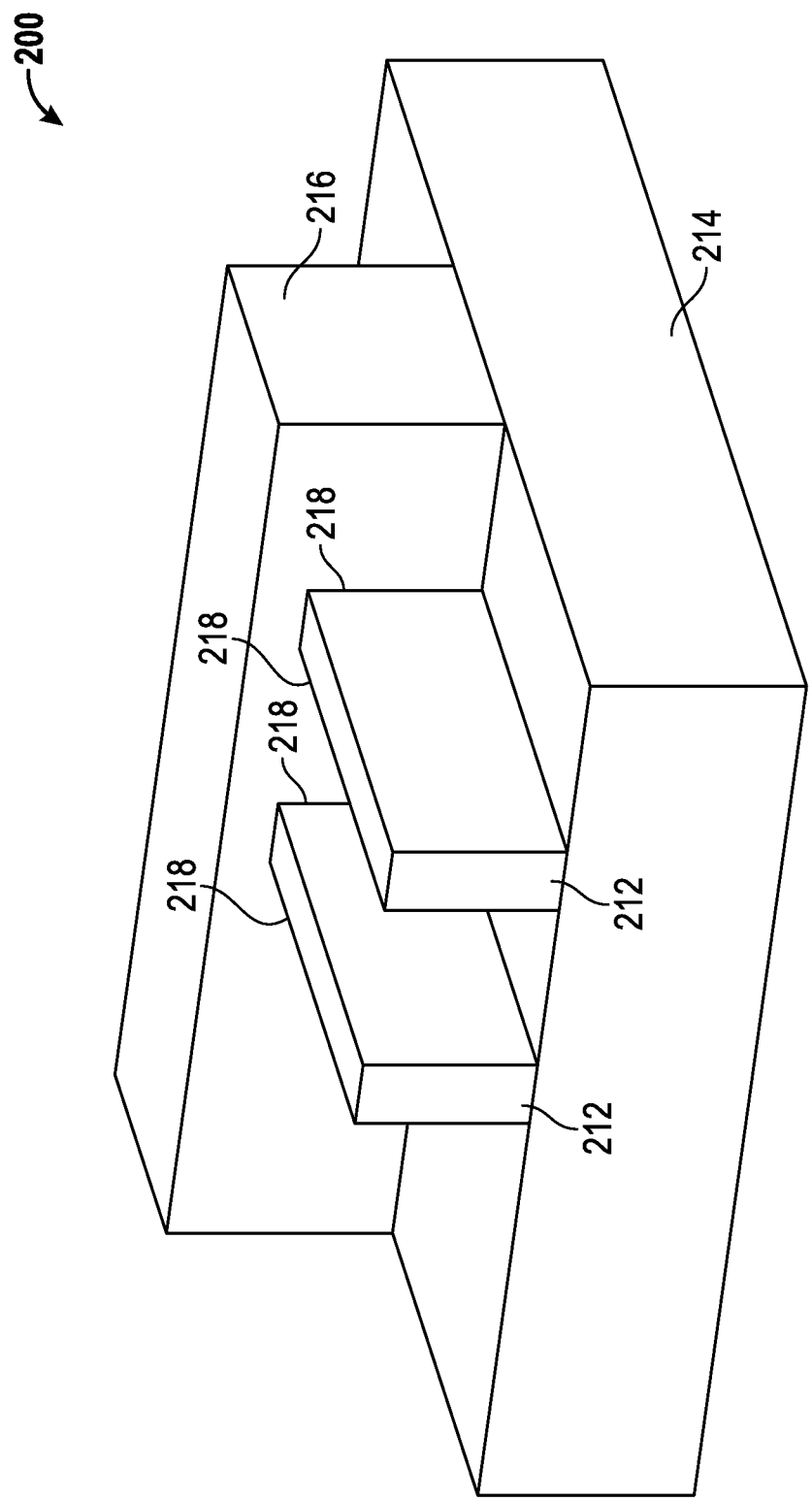
FIG. 1 is a perspective view of a single-gate FinFET as is known in the prior art.
Figure 2:
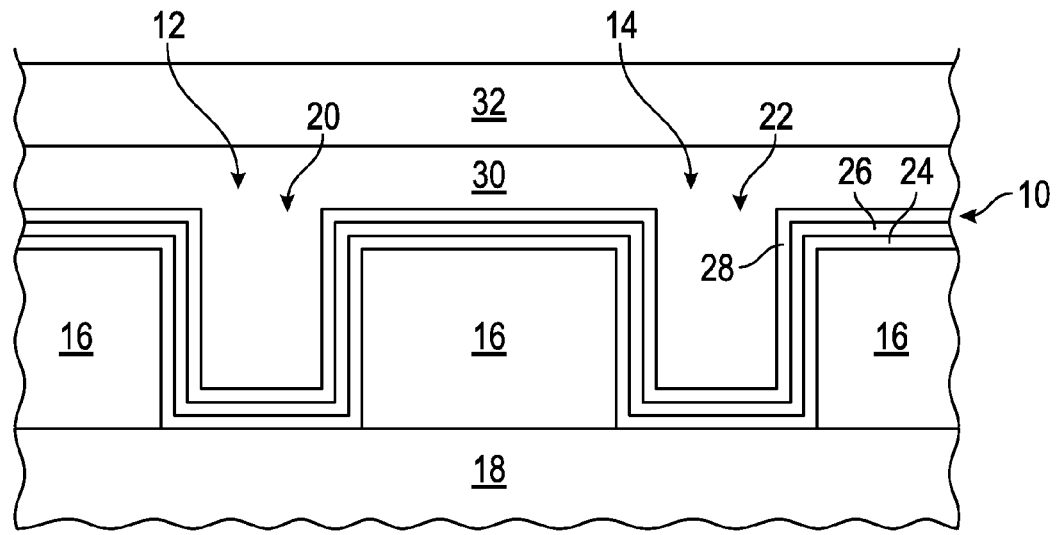
FIGS. 2-5 illustrate in cross-sectional view steps for forming a FinFET as is known in the prior art.
Figure 3:
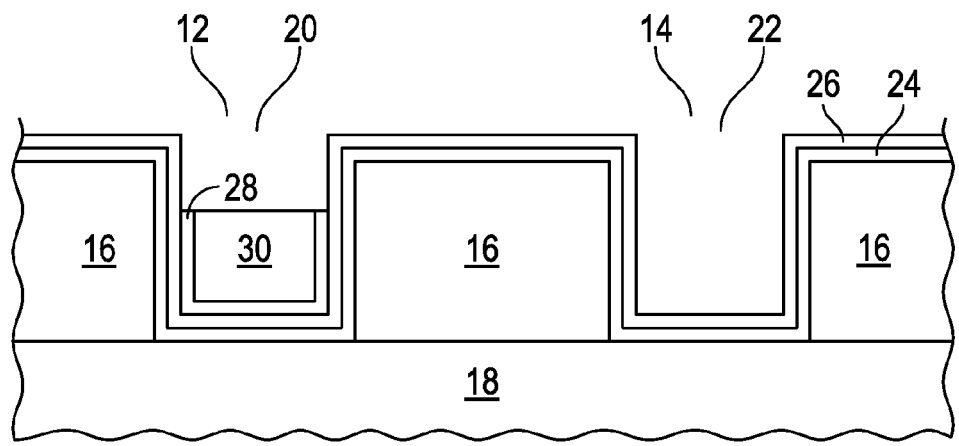
Figure 4:
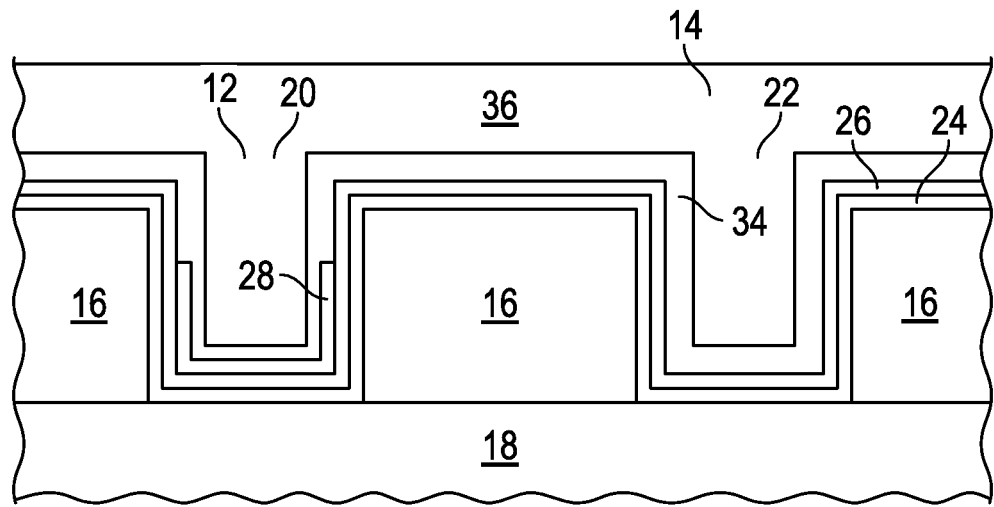
Figure 5:
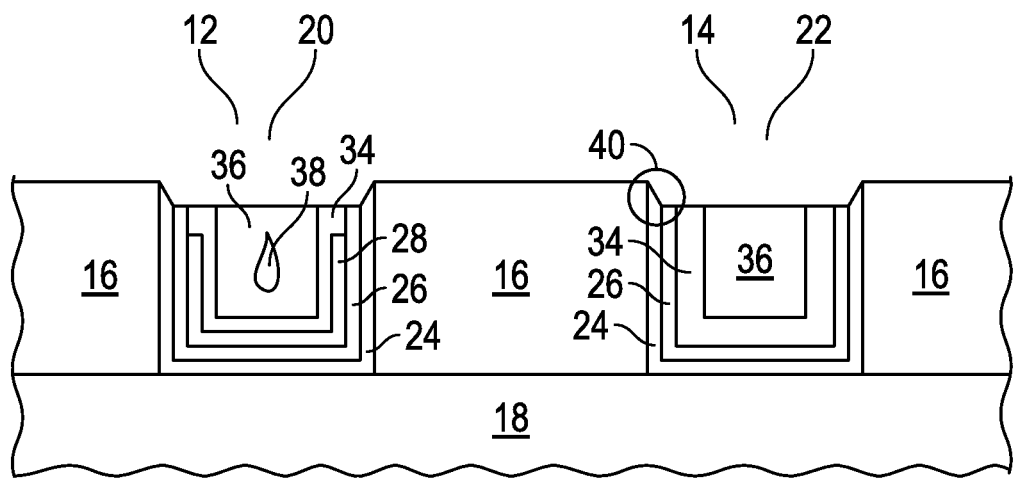
Figure 6:
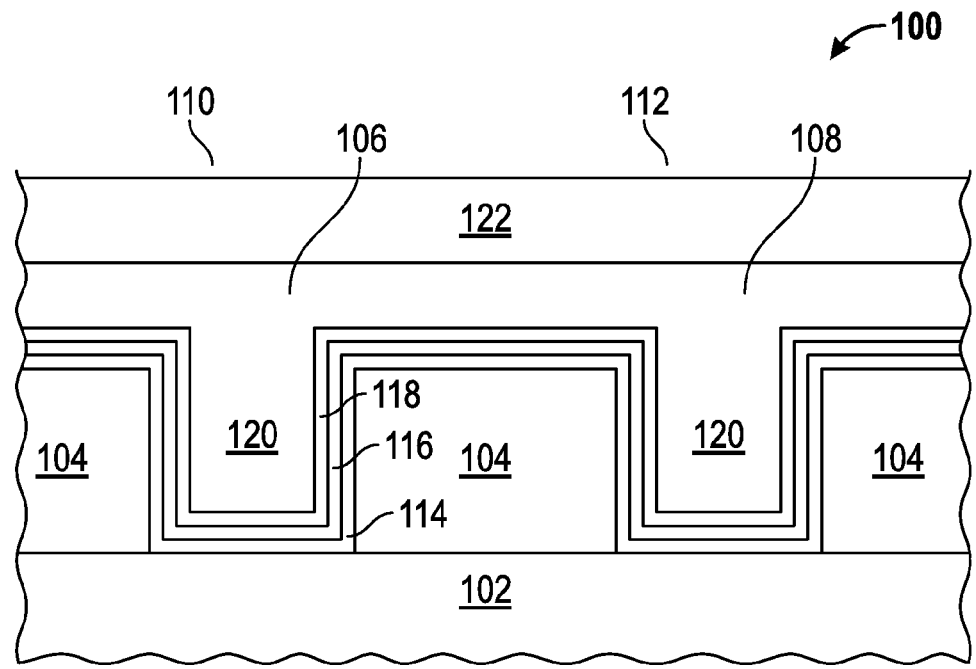

A method for fabricating an integrated circuit (IC) 100 having replacement metal gates with improved threshold voltage is illustrated in FIGS. 6-10. Various steps in the manufacture of ICs are well known and so, in the interest of brevity, many conventional steps will only be mentioned briefly herein or will be omitted entirely without providing the well-known process details. A portion of IC 100 as shown in FIG. 6 is at an early stage of fabrication. The method includes providing a dielectric layer 104 overlying a semiconductor substrate 102 formed of a semiconductor material. As used herein, the term "overlie" means to lie directly on or to lie over such that an intervening material lies there between. For example, dielectric layer 104 may lie directly on semiconductor substrate 102 or may overlie the semiconductor substrate such that a dielectric layer or other layer lies between the dielectric layer 104 and the semiconductor substrate 102. In an exemplary embodiment, the semiconductor substrate 102 is a bulk silicon substrate and the semiconductor material includes silicon. For example, the bulk silicon substrate can be formed from relatively pure silicon, silicon admixed with germanium or carbon, or silicon admixed with some other semiconductor material(s) commonly used in the fabrication of integrated circuits. Alternatively, the semiconductor material of the bulk semiconductor substrate 102 can be germanium, gallium arsenide, or the like. The semiconductor material need not be doped, although it may be very lightly doped as either N-type or P-type, without impacting the manufacturing process described herein. Alternatively, the semiconductor substrate 102 can be supported by a silicon-on-insulator (SOI) wafer disposed on a support substrate. The SOI wafer includes a silicon oxide layer and a silicon-containing material layer overlying the silicon oxide layer. The semiconductor substrate 102 can be the silicon-containing material layer. In another embodiment, the semiconductor substrate 102 is a fin structure of a FinFET formed of a semiconductor material. The dielectric layer 104 is formed of an insulating material such as, for example, silicon oxide.

Figure 7:
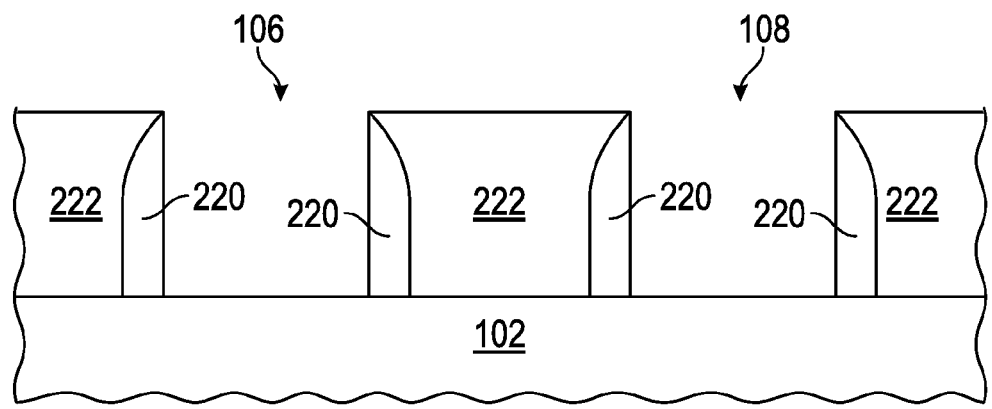

A first trench 106 and a second trench 108 are formed in the dielectric layer 104. A PFET 110 will subsequently be formed in first trench 106 and an NFET 112 will subsequently be formed in second trench 108, as described in more detail below. While the two trenches are illustrated in FIG. 6, it will be appreciated that more than two trenches can be formed in dielectric layer 104. The trenches have a width of about 20 nm to about 500 nm. The trenches can be etched with a plasma etch using, for example, a $N_2/H_2/CH_4$ chemistry. While FIG. 6 illustrates two trenches formed in a dielectric layer 104, it will be appreciate that the replacement metal gates described herein can be formed between two spacers. In this regard, as illustrated in FIG. 7, as is known in the prior art, a dummy gate is formed, for example from polycrystalline silicon, followed by the formation of sidewall spacers 220 about the dummy gates. A dielectric layer 222 is deposited overlying the dummy gates and the sidewall spacers. The dielectric layer is planarized, such as by chemical mechanical planarization (CMP) exposing the dummy gates, and the dummy gates are removed, leaving two trenches 106 and 108 between the sidewall spacers. As used herein, the term "trench" refers to an opening or unoccupied space.

In one embodiment, a gate dielectric layer 114 is deposited within the trenches. The gate dielectric layer 114 is a deposited insulator such as a silicon oxide, silicon nitride, any kind of high-dielectric constant (high-k) material, where the dielectric constant is greater than that of silicon dioxide (3.9), such as hafnium oxides, or the like. Deposited insulators can be deposited, for example, by chemical vapor deposition (CVD), atomic layer deposition (ALD), low pressure chemical vapor deposition (LPCVD), or plasma enhanced chemical vapor deposition (PECVD). In one embodiment, the gate dielectric layer 114 is hafnium oxide having a thickness in the range of from about 10 Å to about 20 Å0 nm, although the actual thickness of the gate dielectric layer 114 can be determined based on the application of the FinFETs in the integrated circuits being implemented.

The method continues with the formation of a metal gate of the PFET 110 and a metal gate of NFET 112. In this regard, barrier metals are formed overlying the gate dielectric layer 114. Metals suitable for use as barrier metals include those that prevent metal ions from the gate electrode (to be discussed below) from migrating into the gate dielectric layer 114 and the dielectric layer 104. In addition, the metals are selected for their ability to adhere to the gate electrode (discussed below) and to the gate dielectric layer 114. In an embodiment, a layer of titanium nitride is formed within the trenches and overlying the gate dielectric layer 114. The titanium nitride can be deposited, for example, by physical vapor deposition (PVD). The thickness of the titanium nitride layer, for example, is in the range of from about 5 Å to about 15 Å. Tantalum nitride is deposited overlying the titanium nitride in the exposed trenches to form a tantalum nitride layer. The tantalum nitride layer is deposited, for example, by PVD. In an embodiment, the tantalum nitride layer has a thickness in the range of from about 3 nm to about 5 nm. The titanium nitride layer overlying the gate dielectric layer 114 and the tantalum nitride layer overlying the titanium nitride layer are designated as bilayer 116 in the figures.

Another titanium nitride layer 118 is formed on the tantalum nitride layer by depositing titanium nitride as described above. The titanium nitride layer can be deposited to a thickness, for example, in the range of from about 3 nm to about 5 nm. A mask material 120 is deposited, filling the first trench 106 and the second trench 108 and a photoresist layer 122 is formed overlying the mask material 120. The mask material 120 can be of any suitable material that has an etch selectivity to tantalum nitride, as discussed in more detail below. An example of a suitable mask material includes, but is not limited to DUO™ 248 available from Honeywell International, Inc. of Morristown, N.J. The mask material 120 is formed overlying the titanium nitride layer 118 by spin coating, roller coating, spraying, and the like. The mask material 120 is deposited to a thickness in the range of from about 130 nm to about 180 nm.

Figure 8:
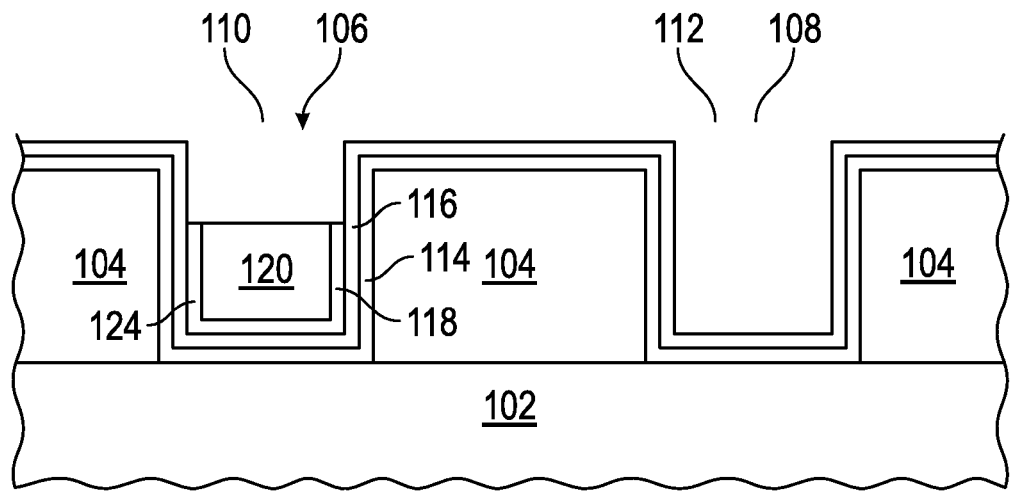

Referring to FIG. 8, the photoresist layer 122 is patterned, the mask material 120 is etched so that it covers a portion 124 of the titanium nitride layer 118 in the first trench 106 of the PFET 110, and the photoresist layer 122 is removed. If the mask material is Honeywell's DUO 248, the mask material 120 can be etched with a plasma etch using, for example, a $N_2/H_2/CH_4$ chemistry. An exposed portion of the titanium nitride layer 118 is removed from the first and second trenches, leaving the unexposed portion 124 in the first trench 106. The titanium nitride is selectively removed by a chemistry such as SPN (sulfuric acid and peroxide) with selectivity of titanium nitride to tantalum nitride above 100 nm. The remaining portion of the mask material 120 then is removed.

Figure 9:
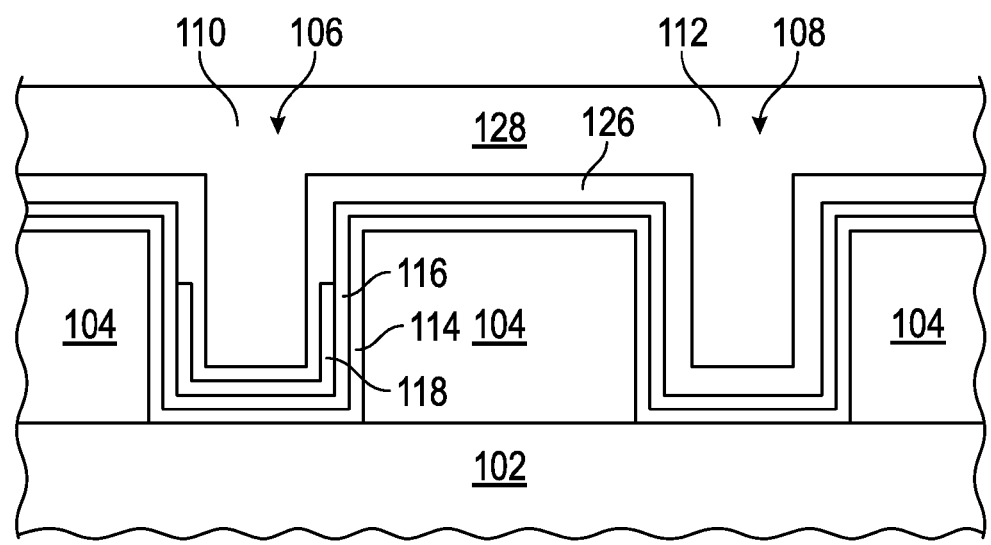

Next, as illustrated in FIG. 9, a work function material, titanium aluminum, is deposited to form a titanium aluminum layer 126 overlying the portion 124 of the titanium nitride layer 118 and the tantalum nitride and titanium nitride bi-layer 116. TiAl effectively stabilizes device threshold voltage performance at a centering target of about 0.3V. In advanced semiconductor manufacturing, the ability to reliably control the threshold voltage parameter, according to specified layout designs, is important to guarantee effective device turn-on performance. The titanium aluminum layer can be deposited, for example, by ALD, and, in an embodiment, has a thickness in the range of from about 4 nm to about 8 nm. Following deposition of the titanium aluminum layer, a second mask material layer 128 is conformally deposited overlying the titanium aluminum layer 126 within the trenches 106 and 108. The second mask material layer 128 is deposited to a thickness in the range of from about 130 nm to about 180 nm. The second mask material layer can be of the same material as mask material 120 and can be etched using the same chemistry used to etch mask material 120.

Figure 10:
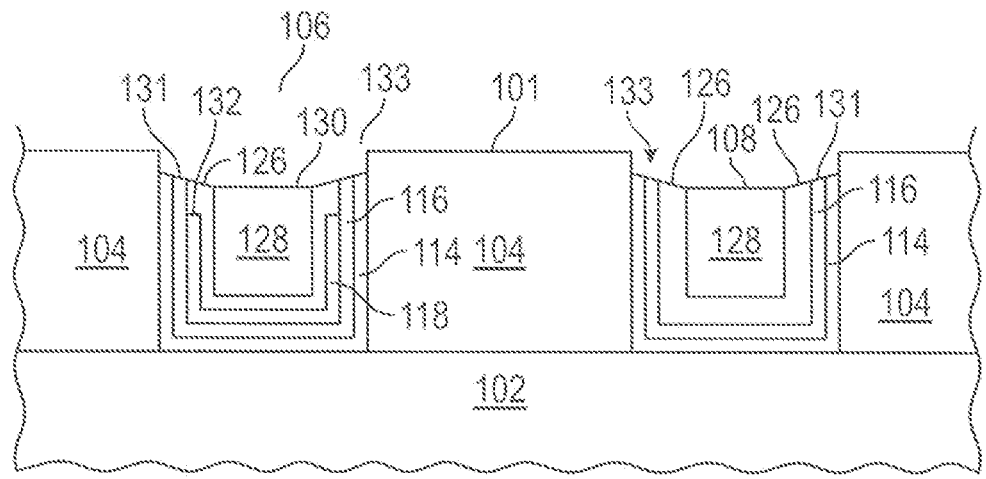

The method continues, referring to FIG. 10, with the etching of second mask material layer 128 until recessed into trenches 106 and 108. In an embodiment, the second mask material layer 128 is etched so that an exposed surface 130 of the second mask material layer 128 is more proximate to the opening 133 of trench 106 than a surface 132 of titanium nitride layer 118 that is most proximate to the opening 133 of trench 106. A portion of the titanium aluminum layer 126 and the exposed barrier metals titanium nitride and tantalum nitride 116, along with the gate dielectric layer 114, also are removed from the trenches 106 and 108. The barrier metal materials and gate dielectric layer, for example hafnium oxide, can be removed by dry plasma etching, such as reactive ion etching (RIE) with $BCl_3/Cl_2$. The second mask material layer 128 protects the titanium aluminum layer 126 and the barrier metals titanium nitride and tantalum nitride from the dry plasma etch. Because the etching is anisotropic, the metals form a chamfered or "V" shape surface 131 proximate to the opening 133 of the trenches relative to a planar surface 101 of the bulk dielectric layer 104.

Figure 11:
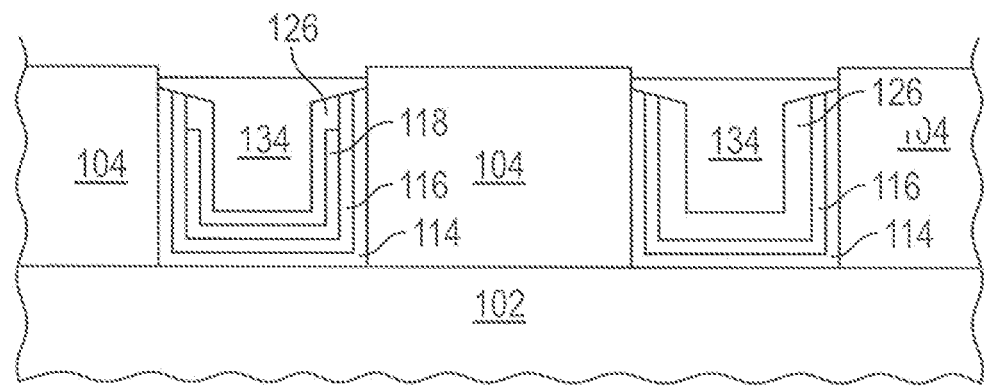

Referring to FIG. 11, after etching of the various metal layers and the gate dielectric, the remaining portion of the second mask material layer 128 is removed. A titanium nitride deposition is performed to globally form a titanium nitride layer (not shown). In an embodiment, the tantalum nitride has a thickness in the range of from about 2 nm to about 4 nm, such as 2.5 nm. Following deposition of the titanium nitride layer, a conductive gate electrode layer 134 is deposited within the trench 106 of the PFET transistor 110 and the trench 108 of the NFET transistor 112 to fill the trenches. The conductive gate electrode 134 can be formed of any suitable conductive metal such as, aluminum or, for example, tungsten. Due to the chamfered surface 131 of the barrier metal materials and the work function material layer, the conductive gate electrode 134 is deposited within the trenches in a "bottom-up"manner that reduces or eliminates voids therein. A CMP process is performed to remove the overburden overlying the dielectric layer 104. In an embodiment, a portion of the conductive gate electrode 134 is removed within the trenches to provide space within the trenches for an insulating cap (not shown) to cover the conductive gate electrodes 134. If the conductive gate electrodes are tungsten, the tungsten can be etched by reactive ion etching (RIE) using a hydrofluoric acid chemistry.

Fabrication of the integrated circuits may thereafter continue with further processing steps that can be performed to complete the integrated circuits, as are well-known in the art. Further steps conventionally include, for example, the formation of source and drain regions in the semiconductor substrate aligned to the replacement metal gates (formed by removing the dielectric layer and implanting conductivity-determining ions into the semiconductor substrate), the formation of contacts (formed by depositing a photoresist material layer over an insulating layer, lithographic patterning, etching to form contact voids, and depositing a conductive material in the voids to form the contacts), and the formation of one or more patterned conductive layers across the device above the insulating layer, among many others. The subject matter disclosed herein is not intended to exclude any subsequent processing steps to form and test the completed circuits as are known in the art. Furthermore, with respect to any of the process steps described above, one or more heat treating and/or annealing procedures can be employed after the deposition of a layer, as is commonly known in the art.

Accordingly, methods for fabricating integrated circuits having replacement metal gates with improved threshold voltage performance and integrated circuits having replacement metal gates with improved threshold voltage performance have been described. The replacement metal gates are formed with metal layers having a chamfered or "V" shape surface that permits formation of conductive gate electrodes with minimal or no voids. Thus, etch back of the gate electrodes to remove voids is avoided and gate electrode variability is minimized. In addition, because voids formed in the conductive gate electrodes are minimized or eliminated altogether, undesirable etching of the conductive gate electrodes may not be necessary and more conductive gate electrode material may stay in the trenches. This greatly improves contact resistance. Further, titanium aluminum work function material is utilized in the replacement metal gates to stabilize threshold voltage. Gate dielectric stringers also are removed, as the metal layers in the trenches are protected by the second mask material layer, which is deposited after the work function material is deposited but before the gate electrode metal is deposited. In this regard, a novel layout is provided that comprises improvements to drive threshold voltage performance typically required by device design specifications.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating an integrated circuit, the method comprising: providing a bulk dielectric layer overlying a semiconductor substrate, the bulk dielectric layer having a first trench and a second trench; forming a gate dielectric layer in the first trench and the second trench; forming a first barrier layer overlying the gate dielectric layer; forming a work function material layer within the first trench and the second trench; recessing the work function material layer and the first barrier layer in the first trench and the second trench, wherein the work function material layer and the first barrier layer form a chamfered surface relative to and below the top planar surface of the bulk dielectric layer; recessing the gate dielectric layer in the first trench and the second trench; depositing a conductive gate electrode material such that it fills the first trench and the second trench; and recessing the conductive gate electrode material in the first trench and the second trench.

2. The method of claim 1, further comprising forming a second barrier layer after forming the first barrier layer, wherein the second barrier layer overlies a portion of the first barrier layer in the first trench but is absent from the second trench.

3. The method of claim 2, wherein forming the second barrier layer comprises:
    forming the second barrier layer overlying the first barrier layer;
    forming a mask on the second barrier layer;
    forming a photoresist on the mask;
    patterning the photoresist to form a patterned photoresist;
    etching the mask using the patterned photoresist as an etch mask;
    removing the second barrier layer from the second trench and a portion of the first trench.

4. The method of claim 3, wherein forming the second barrier layer comprises forming a titanium nitride layer.

5. The method of claim 1, wherein providing the dielectric layer comprises providing a hafnium oxide layer and wherein recessing the gate dielectric layer comprises etching gate dielectric layer stringers using a dry plasma etch.

6. The method of claim 1, wherein depositing the first barrier layer comprises depositing a titanium nitride layer.

7. The method of claim 6, wherein depositing the first barrier layer comprises depositing a tantalum nitride layer overlying the titanium nitride layer.

8. The method of claim 1, wherein forming the work function material layer comprises forming titanium aluminum.

9. The method of claim 1, wherein recessing the work function material layer and the first barrier layer comprises:
    depositing a mask material overlying the work function material layer after forming the work function material layer;
    forming a patterned photoresist on the mask material;
    etching the mask material using the patterned photoresist as an etch mask, wherein the mask material remains in the first trench and the second trench;
    removing a portion of the work function material layer using the mask material, the first barrier layer and the gate dielectric layer as an etch mask; and
    removing a portion of the first barrier layer using the mask material, the work function material layer, and the gate dielectric layer as an etch mask.

10. The method of claim 1, wherein depositing the conductive gate electrode material comprises depositing tungsten.

11. The method of claim 1, wherein providing the bulk dielectric layer overlying the semiconductor substrate comprises providing the bulk dielectric layer overlying a fin structure of a subsequently-formed FinFET device.

12. The method of claim 1, wherein the gate dielectric layer is in physical contact with sidewall spacers.

13. A method for fabricating an integrated circuit, the method comprising:
    providing a dielectric layer overlying a semiconductor substrate, the dielectric layer having a first trench and a second trench;

forming a gate dielectric layer in the first trench and the second trench;

forming a first barrier metal layer overlying the gate dielectric layer;

depositing a second barrier metal layer overlying the first barrier metal layer;

forming a patterned mask such that the patterned mask partially fills the first trench and overlies a first portion of the second barrier metal layer, and wherein a second portion of the second barrier metal layer is exposed;

removing the second portion of the second barrier metal layer;

removing the patterned mask;

forming a work function material layer within the first trench and the second trench;

forming a mask material within the first trench and the second trench;

etching the mask material such that the mask material fills a portion of the first trench and a portion of the second trench;

anisotropically etching a portion of the work function material layer and a portion of the first barrier metal layer;

etching a portion of the gate dielectric layer;

removing the mask material from the first trench and the second trench;

depositing a conductive gate material overlying the work function material layer in the first trench and the second trench; and removing a portion of the conductive gate material within the first trench and the second trench.

14. The method of claim 13, wherein etching a portion of the gate dielectric layer comprises etching a portion of the gate dielectric layer using a dry plasma process.

15. The method of claim 13, wherein anisotropically etching a portion of the work function material layer and a portion of the first barrier metal layer comprises forming a beveled surface of the first barrier metal layer and the work function material layer.

16. The method of claim 13, wherein forming the gate dielectric layer comprises forming a hafnium oxide layer.

17. The method of claim 13, wherein forming the first barrier metal layer comprises depositing a titanium nitride layer and depositing a tantalum nitride layer overlying the titanium nitride layer.

18. The method of claim 13, wherein forming the work function material layer comprises forming a titanium aluminum layer.

19. The method of claim 13, wherein depositing the second barrier metal layer comprises depositing a titanium nitride layer.

* * * * *